(12) United States Patent
Richards et al.

(10) Patent No.: US 6,405,230 B1
(45) Date of Patent: Jun. 11, 2002

(54) DIGITAL FILTER

(75) Inventors: David Charles William Richards; John William Richards, both of Stockbridge; Paul Anthony Frindle, Witney, all of (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 09/285,402

(22) Filed: Apr. 2, 1999

(30) Foreign Application Priority Data

Apr. 3, 1998 (GB) .............................................. 9807243

(51) Int. Cl.[7] .............................................. G06F 17/10
(52) U.S. Cl. .......................................................... 708/306
(58) Field of Search ................................. 708/306, 320

(56) References Cited

U.S. PATENT DOCUMENTS

| | | | |
|---|---|---|---|
| 4,213,187 A | * 7/1980 | Lawrence et al. | 708/306 |
| 4,305,133 A | * 12/1981 | Amada et al. | 708/306 |
| 4,920,507 A | * 4/1990 | Takeda | 708/306 |
| 5,148,382 A | * 9/1992 | Kishi | 708/306 |
| 5,195,140 A | * 3/1993 | Kudo et al. | 708/306 |
| 5,687,101 A | * 11/1997 | Lee | 708/306 |
| 5,740,091 A | * 4/1998 | Fukui et al. | 708/306 |
| 5,894,428 A | * 4/1999 | Harada | 708/306 |

FOREIGN PATENT DOCUMENTS

GB    2081 544    2/1982

* cited by examiner

*Primary Examiner*—David H. Malzahn
(74) *Attorney, Agent, or Firm*—Frommer Lawrence & Haug LLP; William S. Frommer

(57) ABSTRACT

A method of generating filter coefficients to provide a desired nth order filter response comprises adding one or more substantially co-located pole and zero pairs to form an (n+m)th order filter having the desired nth order filter response.

5 Claims, 4 Drawing Sheets

DIGITAL FILTER

BACKGROUND OF THE INVENTION

1. Field of the Invention

This invention relates to digital filters.

2. Description of the Prior Art

In digital signal processing apparatus such as a digital audio mixing console, recursive digital filters are used for signal processing operations such as those required in equalisation sections.

The general form of a transfer response of a first order recursive digital filter is:

$$H(z) = \frac{a_0 + a_1 z^{-1}}{1 + b_1 z^{-1}} \quad (1)$$

This equation is implemented digitally as a series of multiplies and delays, corresponding to each term in the equation.

An example implementation of the filter of equation (1) is shown in FIG. 1 of the accompanying drawings. In FIG. 1, the input signal samples are supplied to a multiplier 10 (multiplication by a coefficient $a_0$) and also to a one-sample delay ($z^{-1}$) 20. Samples delayed by the delay 20 are multiplied 30 by a coefficient $a_1$. An adder 40 adds the output of the multipliers 10, 30 and the output of a further multiplier 60 which multiplies output samples y(n), delayed 50 by one sample, by a coefficient $b_1$. The output of the adder 40 forms the output samples y(n).

A problem with the use of such filters is that the so-called limit cycle behaviour can reduce the performance of the filters in high fidelity audio applications.

One example of this limit cycle behaviour is the response of a filter when the input of the filter is reduced to zero. Rounding errors caused by the use of finite precision arithmetic mean that the output of the filter does not necessarily reduce to zero when the input reduces to zero. Instead, the output can stay at a non-zero value or oscillate about zero. In an audio system this is heard as a deterioration of the audio performance.

An example of limit cycle behaviour can be derived from equation 1. The difference equation by which output samples y(n) may be calculated from input samples x(n) is as follows:

$$y(n) = a_0 x(n) + a_1 x(n-1) - b_1 y(n-1) \quad (2)$$

To demonstrate the zero input limit cycle behaviour, x(n) and x(n−1) are set to zero and an initial condition is substituted for y(n−1):

$$y(n) = 0 - b_1 y(n-1) \quad (3)$$

In a specific example, for a filter having a sampling rate of 25Hz and a decay time of approximately 2 seconds, $a_0 = a_1 = 0.045$, and $b_1 = -0.955$. Taking the initial condition of y(−1)=15, the following outputs for integer arithmetic can be derived:

| n | y(n) exact | y(n) rounded |
|---|---|---|
| −1 | 15.0 | 15 |
| 0 | 14.325 | 14 |
| 1 | 13.68 | 13 |
| 2 | 13.06 | 12 |
| 3 | 12.4768 | 11 |
| 4 | 11.915 | 11 |
| 5 | 11.379 | 11 |
| 6 | 10.867 | 11 |
| 7 | 10.378 | 11 |
| ... | ... | ... |
| infinity | 0 | 11 |

This example demonstrates a limit cycle with zero frequency (i.e. a steady error value is output). However, if $b_1$ were positive then the rounded y(n) would alternate in sign, oscillating at one half of the sampling rate. As the absolute value of $b_1$ approaches 1, the magnitude of the zero input limit cycle output gets larger and larger.

Attempts to overcome or alleviate this problem have included varying the circuit or program design used to implement the filter—for example, the so-called "Lattice form", the "Transpose form", the "Gold-Rader Structure" and others have been tried, but even where these filters have given a slightly improved limit cycle performance, they have had a worse performance in another area important in audio applications.

Double precision operation has also been tried, as a straightforward way of reducing the effect of the rounding errors which lead to limit cycle problems, but their use requires too much processing capacity to be a useful solution. In some instances, where double precision operations (e.g. multiplies or additions) are built from combinations of single precision operations, it has been found that a double precision filter requires seven times the number of operations of an equivalent single precision filter.

SUMMARY OF THE INVENTION

This invention provides a recursive nth-order digital filter, where n is greater than 1, the filter having a pole-zero pair substantially co-located in the z-plane.

The elegantly simple solution provided by the invention is to change the way in which a filter response is calculated (i.e. implemented as a digital filter) without necessarily changing the actual response of the filter.

Referring to the example of equation (1) above, the response described in equation (1) is multiplied by a further expression having an identical numerator and denominator (i.e. a further expression equal to one):

$$H(z) = \frac{a_0 + a_1 z^{-1}}{1 + b_1 z^{-1}} \cdot \frac{1 + \gamma z^{-1}}{1 + \gamma z^{-1}} \quad (4)$$

This gives a revised expression which is equal to the first equation given above.

$$H(z) = \frac{a_0 + z^{-1}(a_0 \gamma + a_1) + \gamma a_1 z^{-2}}{1 + z^{-1}(b_1 + \gamma) + b_1 \gamma z^{-2}} \quad (5)$$

Because this expression is equal to the first expression given above, it provides the same filter response. However, more terms are used in calculating the response, which has the effect that when it is implemented digitally, limit cycle problems caused by rounding errors are reduced.

Another view of the revised filter implementation is that the equivalent of an additional pole and an additional zero have been added at identical positions in the z plane. The filter of equation (5) is now a second order filter but has the same frequency and phase response (except in limit cycle behaviour) as the first order filter of equation (1). The additional processing overhead required to implement the revised filter of equation (5) is much less than the seven-fold increase needed to use double precision arithmetic. In embodiments of the invention (e.g. an audio filter embodiment to be described below) an improvement of around 10 dB in the signal to noise ratio can be obtained at audio frequencies below about 100 Hz.

The invention also provides a method of generating filter coefficients to provide a desired nth order filter response (e.g. where n is an integer greater than or equal to 1), the method comprising adding one or more substantially co-located pole and zero pairs to form an (n+m)th order filter having the desired nth order filter response (e.g. where m is an integer equal to 1 or more).

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
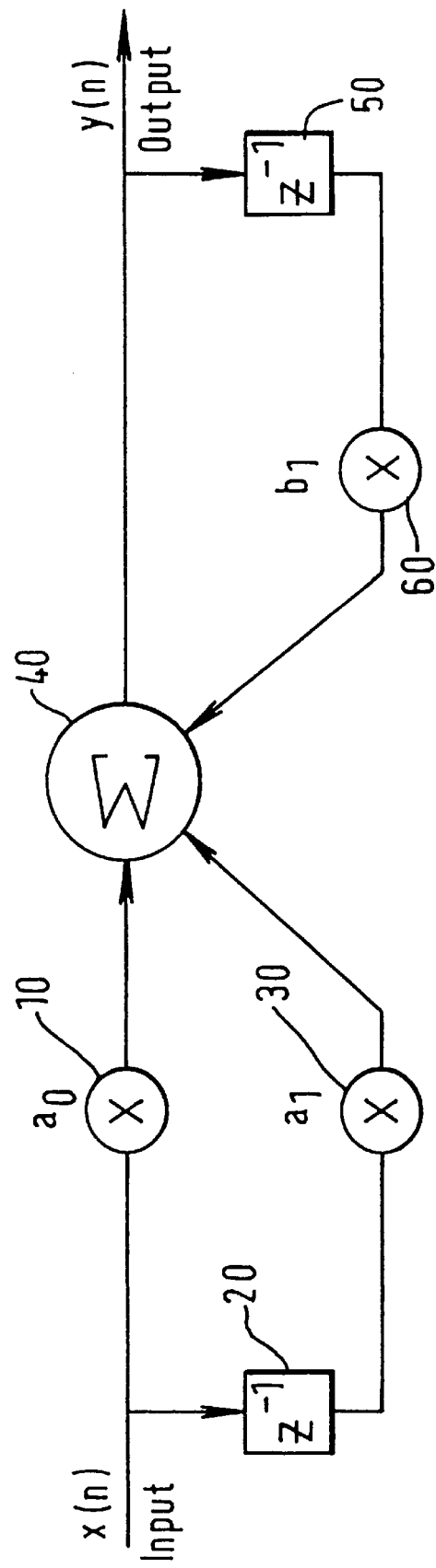
FIG. 1 schematically illustrates a previously proposed first order recursive digital filter.
Figure 2:
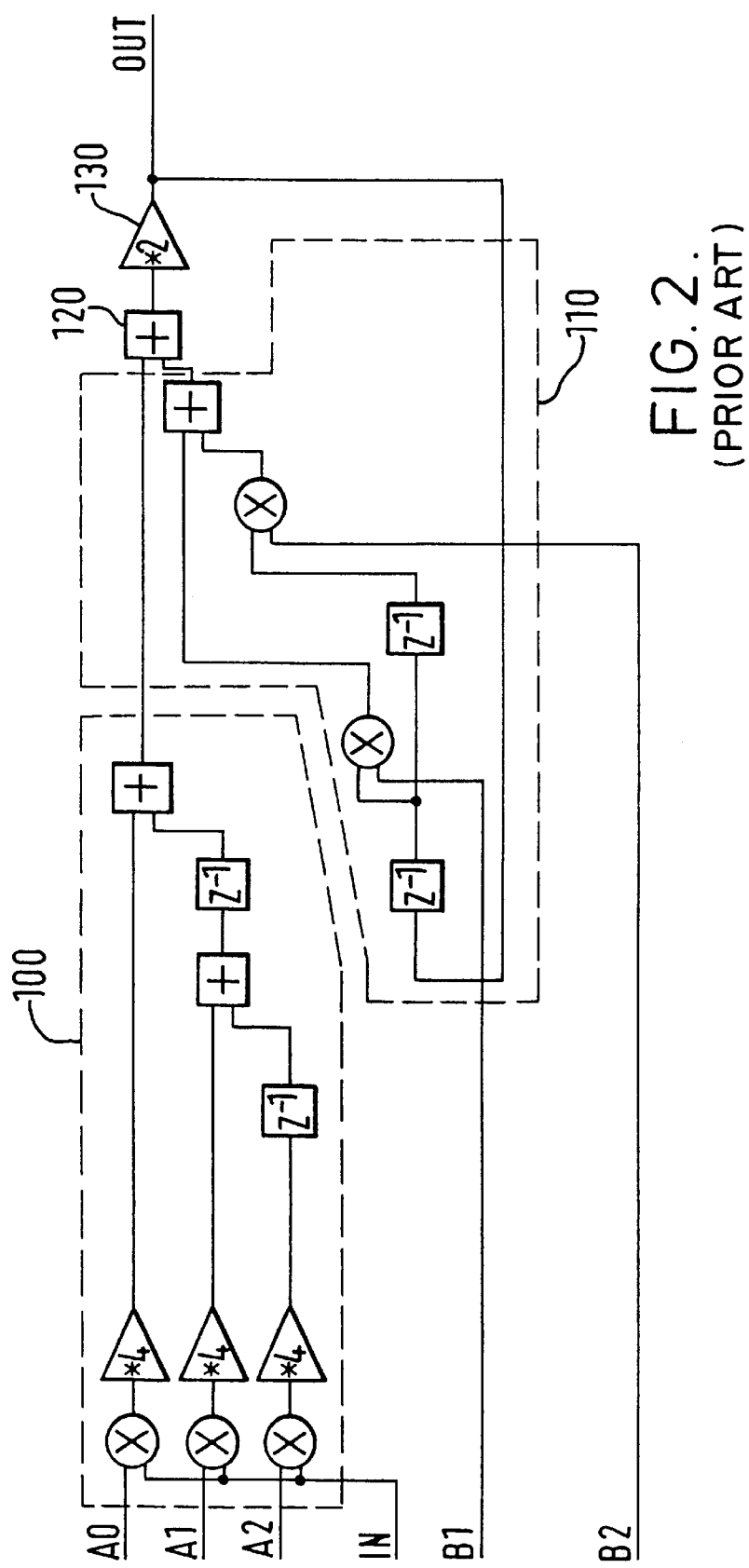
FIG. 2 schematically illustrates a previously proposed second order recursive digital filter.

Referring now to FIG. 2, the previously proposed second order filter comprises a first section 100 in which the sum is generated of input samples x(n):

multiplied by a coefficient $a_0$;

delayed by one sample and multiplied by a coefficient $a_1$; and delayed by two samples and multiplied by a coefficient $a_2$.

Similarly, a second section 110 receives a feedback of output samples y(n), and generates the sum of the output samples y(n):

delayed by one sample period and multiplied by a coefficient $b_1$; and delayed by two sample periods and multiplied by a coefficient $b_2$.

The respective outputs of the first section and the second section are summed by an adder 120. A scaling multiplier 130 then follows.

The previously proposed filter of FIG. 2 implements a second order recursive filter function, and designs similar to this have been used in applications such as equalisation sections of digital audio mixing consoles.

Figure 3:
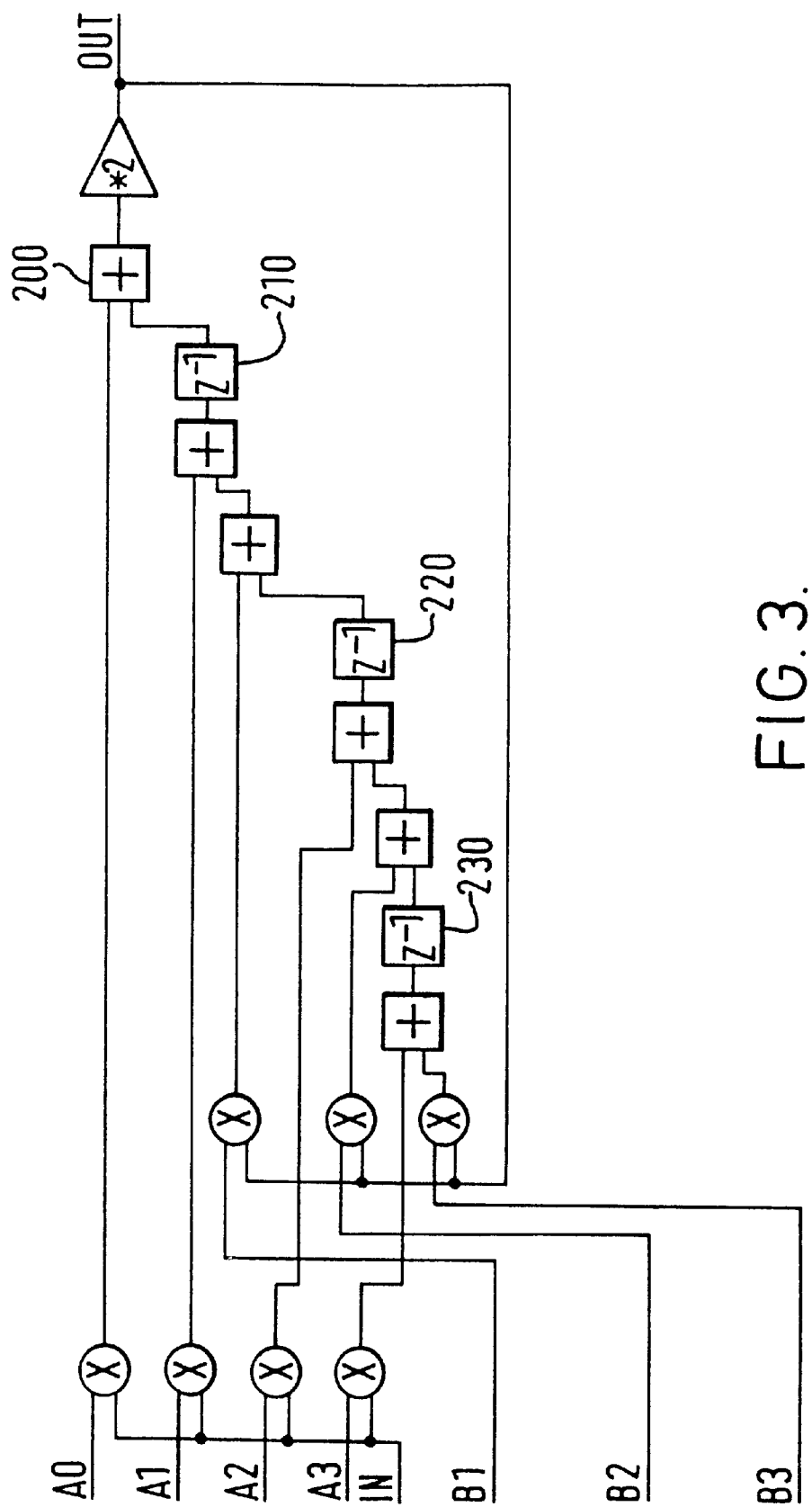
FIG. 3 schematically illustrates a digital filter according to an embodiment of the invention.

FIG. 3 schematically illustrates a digital filter according to an embodiment of the invention.

In FIG. 3, the circuit layout is a little different to that of FIG. 2, and the operation will be described below. However, a more important technical difference is that the filter operates with the response of a second order filter but implemented as a third order filter to give reduced limit cycle problems. Again, this will be described further below.

Turning to the circuit operation, input samples x(n) are multiplied by four coefficients $A_0 \ldots A_3$. The product with coefficient $A_0$ is passed directly to an output adder 200. The product with coefficient $A_1$ is routed via a single delay element 210 to the output adder 200. The product with coefficient $A_2$ is routed via two delay elements 220, 210 to the output adder 200. Finally, the product with coefficient $A_3$ is routed via three delay elements 230, 220, 210 to the output adder 200. This produces the response terms $(A_0+A_1z^{-1}+A_2z^{-2}+A_3z^{-3})$.

Similarly, in the feedback path, output samples are fed back to three multipliers where they are multiplied by respective coefficients $B_1$, $B_2$ and $B_3$. The product with coefficient $B_1$ is routed via the delay element 210 to the output adder 200. The product with coefficient $B_2$ is routed via the two delay elements 220, 210 to the output adder 200. Finally, the product with coefficient $B_3$ is routed via the three delay elements 230, 220, 210 to the output adder 200. So, the remaining part of a third order response is generated.

However, the coefficients for the filter of FIG. 2 are selected so that the response of the filter actually matches that of a second order filter; but with a much improved limit cycle behaviour.

The response of a second order recursive filter is as follows:

$$H(z) = \frac{a_0 + a_1 z^{-1} + a_2 z^{-2}}{1 + b_1 z^{-1} + b_2 z^{-2}} \quad (6)$$

If this response is multiplied by an expression equal to unity, no change to the response is effected. So, the response of equation 6 will be multiplied by the unity expression:

$$\frac{1 + \gamma z^{-1}}{1 + \gamma z^{-1}} \quad (7)$$

to give the response:

$$H(z) = \frac{a_0 + a_1 z^{-1} + a_2 z^{-2}}{1 + b_1 z^{-1} + b_2 z^{-2}} \cdot \frac{1 + \gamma z^{-1}}{1 + \gamma z^{-1}} \quad (8)$$

This gives a revised expression which provides a filter response equal to equation 6 given above.

$$H(z) = \frac{a_0 + z^{-1}(a_0\gamma + a_1) + z^{-2}(a_2 + a_1\gamma) + \gamma a_2 z^{-3}}{1 + z^{-1}(b_1 + \gamma) + z^{-2}(b_2 + \gamma b_1) + \gamma b_2 z^{-3}} \quad (9)$$

If, when the above equation 9 is implemented in a circuit such as that of FIG. 3, the coefficients in the circuit of FIG. 3 are set so that:

$A_0 = a_0$
$A_1 = a_0\gamma + a_2$
$A_2 = a_1\gamma + a_2$
$A_3 = a_2\gamma$
$B_1 = b_1 + \gamma$
$B_2 = b_2 + \gamma b_1$
$B_3 = \gamma b_2$ then the third order filter of FIG. 3 will exhibit the second order response of equation 6. However, in implementing this filter digitally, limit cycle problems are reduced and the signal to noise ratio is improved in comparison to the implementation as a simpler second order filter such as that of FIG. 2.

One way of considering the revised response of equation 9 with the conditions listed above applied to the filter coefficients is that there are a pole and a zero at identical positions in the so-called z-plane. Because they are at identical positions they have no effect on the filter response, but when it comes to implementing the filter digitally, the arrangement of FIG. 3 will exhibit far less significant problems of limit cycle behaviour than the filter of FIG. 2 for the same overall filter response.

In an example of a z-plane representation of a typical second order filter implemented with the substantially co-located additional pole and zero described above, the additional pole and zero can be +0.9 on the real axis. However, the actual position of the substantially co-located additional pole and zero is relatively flexible and can be varied empirically if desired, so long as they fall within the unit circle in the z-plane. Furthermore, in terms of an equation describing a filter response, the additional pole and zero can of course be exactly co-located. In a real implementation, there might be a small deviation between their positions (e.g. because of rounding errors etc).

Figure 4:
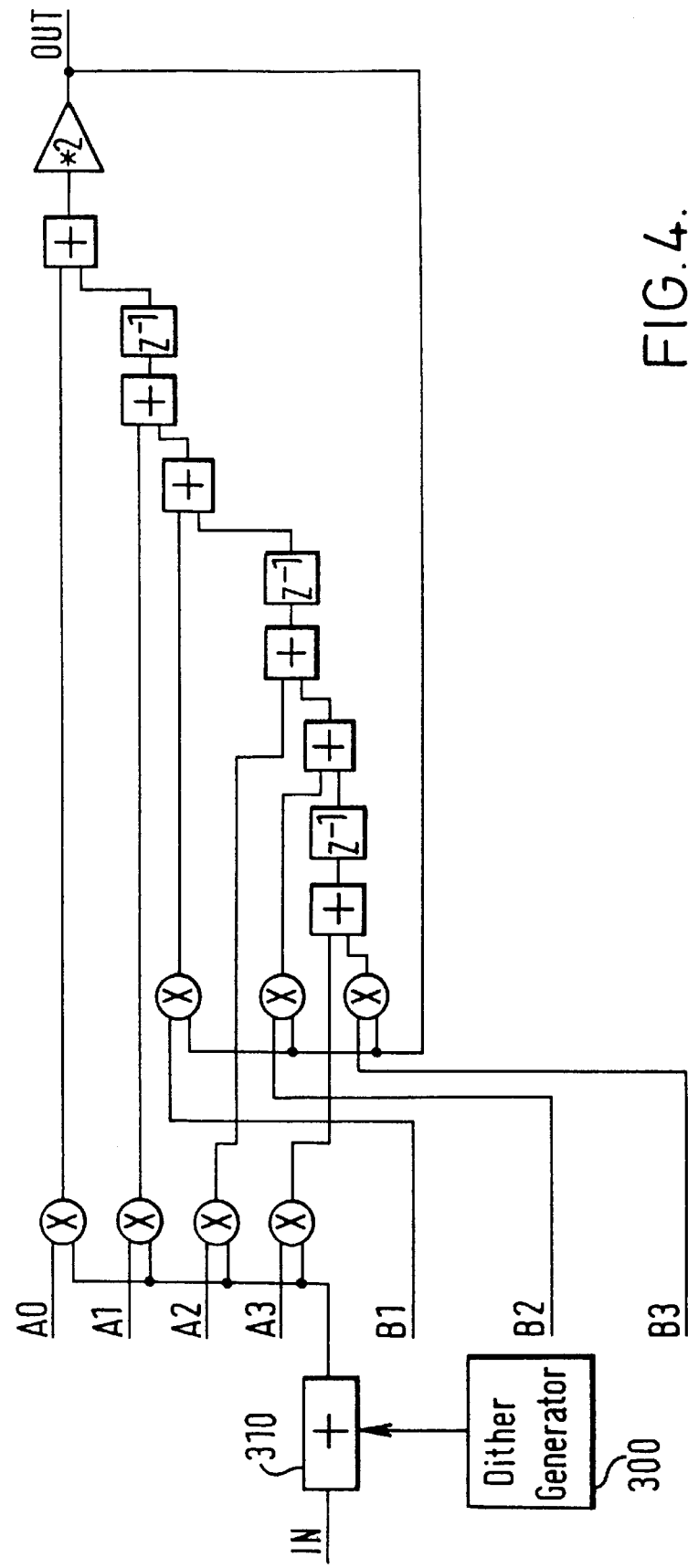
FIG. 4 schematically illustrates a modification of the filter of FIG. 3.

Of course, more than one such substantially co-located pole/zero pair can be used. In particular, complex conjugate poles and zeroes can be implemented. FIG. 4 schematically illustrates a modification of FIG. 3 in which, in order to reduce further the effects of limit cycle behaviour, a dither signal from a dither generator 300 (or another part of a larger apparatus such as an audio mixing console) is added 310 to input samples x(n).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A recursive nth-order digital filter, where n is greater than 1, comprising:

multiplying means for multiplying a signal with a plurality of coefficients to produce a plurality of products;

delay means for delaying said plurality of products; and adding means for combining said plurality of products, wherein said filter has a pole-zero pair substantially co-located in the z-plane to give a desired (n−1)th order filter response.

2. The recursive n-th order digital filter according to claim 1, further comprising a dither combiner for adding a dither signal to an input signal applied to said filter.

3. An audio processing apparatus having nth-order digital filter, where n is greater than 1, comprising:

multiplying means for multiplying a signal with a plurality of coefficients to produce a plurality of products;

delay means for delaying said plurality of products; and adding means for combining said plurality of products, wherein said filter has a pole-zero pair substantially co-located in the z-plane to give a desired (n−1)th order filter response.

4. An audio processing apparatus having nth-order digital filter, where n is greater than 1, comprising:

multiplying means for multiplying a signal with a plurality of coefficients to produce a plurality of products;

delay means for delaying said plurality of products; and adding means for combining said plurality of products;

a dither combiner for adding a dither signal to an input signal applied to said filter, wherein said filter has a pole-zero pair substantially co-located in the z-plane to give a desired (n−1)th order filter response.

5. A method of generating filter coefficients to provide a desired n-th order filter response filter, where n is greater than 1, comprising the steps of:

receiving one or more substantially co-located pole and zero pairs; and adding said received pole and zero pairs to form an (n+m)th order filter having the desired nth order filter response.

* * * * *